(12) United States Patent
Tseng et al.

(10) Patent No.: US 8,390,125 B2
(45) Date of Patent: Mar. 5, 2013

(54) THROUGH-SILICON VIA FORMED WITH A POST PASSIVATION INTERCONNECT STRUCTURE

(75) Inventors: Ming-Hong Tseng, Toufen Township (TW); Sheng Huang Jao, Jiayi (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 87 days.

(21) Appl. No.: 13/052,258

(22) Filed: Mar. 21, 2011

(65) Prior Publication Data

US 2011/0169168 A1 Jul. 14, 2011

Related U.S. Application Data

(63) Continuation of application No. 12/684,859, filed on Jan. 8, 2010, now Pat. No. 7,932,608.

(60) Provisional application No. 61/154,979, filed on Feb. 24, 2009.

(51) Int. Cl.
*H01L 23/48* (2006.01)
(52) U.S. Cl. .. 257/771; 257/741; 257/774; 257/E23.011
(58) Field of Classification Search .................. 257/741, 257/771, 774, E23.011
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,026,233 B2 | 4/2006 | Cheng et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |

(Continued)

FOREIGN PATENT DOCUMENTS

CN 101006582 7/2007

OTHER PUBLICATIONS

Office Action issued by SIPO for corresponding application No. 201010119558.3.

*Primary Examiner* — Kimberly Rizkallah
*Assistant Examiner* — Marvin Payen
(74) *Attorney, Agent, or Firm* — Lowe Hauptman Ham & Berner, LLP

(57) ABSTRACT

An integrated circuit structure includes a semiconductor substrate, a through-silicon via (TSV) extending into the semiconductor substrate, a pad formed over the semiconductor substrate and spaced apart from the TSV, and an interconnect structure formed over the semiconductor substrate and electrically connecting the TSV and the pad. The interconnect structure includes an upper portion formed on the pad and a lower portion adjacent to the pad, and the upper portion extends to electrically connect the TSV.

11 Claims, 3 Drawing Sheets

U.S. PATENT DOCUMENTS

| | | |
|---|---|---|
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2007/0048969 A1 | 3/2007 | Kwon et al. |
| 2009/0026614 A1 | 1/2009 | Jung |

THROUGH-SILICON VIA FORMED WITH A POST PASSIVATION INTERCONNECT STRUCTURE

CROSS REFERENCE TO RELATED APPLICATIONS

This application is a Continuation of U.S. application Ser. No. 12/684,859, filed Jan. 8, 2010, which in turn claims priority to U.S. Provisional Application No. 61/154,979, filed Feb. 24, 2009, which are incorporated herein by reference in their entireties.

TECHNICAL FIELD

One or more embodiments relate to the fabrication of semiconductor devices, and more particularly, to the fabrication of a through-silicon via and a post passivation interconnect structure.

BACKGROUND

The semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area. These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required. An additional limitation comes from the significant increase in the number and length of interconnections between devices as the number of devices increases. When the number and the length of interconnections increase, both circuit RC delay and power consumption increase. Among the efforts for resolving the above-discussed limitations, three-dimensional integrated circuit (3DIC) and stacked dies are commonly used.

Through-silicon vias (TSVs) are thus used in 3DIC and stacked dies for connecting dies. In this case, TSVs are often used to connect the integrated circuits on a die to the backside of the die. In addition, TSVs are also used to provide short grounding paths for grounding the integrated circuits through the backside of the die, which may be covered by a grounded metallic film. An integrated circuit generally includes contact regions for connecting the integrated circuit to other circuits. Contact-bonding (CB) pads are generally formed in metal layers, e.g., the top level of metal, which connect to the TSV through a post passivation interconnect (PPI) structure. A conventional PPI process, however, provides weak adhesion to the CB pad and causes a high contact resistance. Accordingly, there is a need for an improved structure and a method of fabricating such to avoid the shortcomings of the conventional process.

BRIEF DESCRIPTION OF THE DRAWINGS

The following detailed description is made in reference to the accompanying drawings, wherein.

DETAILED DESCRIPTION

The present disclosure relates generally to the fabrication of via structures, which can be applied to the fabrication of through-silicon vias (TSVs) with post passivation interconnect (PPI) structures connecting to a contact-bonding (CB) pad for forming a vertical interconnection on stacked wafers/dies. Through-silicon via (TSV), also referred to as through-substrate via or through-wafer via, as defined herein, provides a connection between one or more conductive layers (e.g. metal interconnect layers, contact pads including bonding pads) on a substrate, between a conductive layer (e.g. metal interconnect layer) and a semiconductor layer (such as a silicon feature), and/or other desired connections between features formed on or coupled to a substrate. In some embodiments, the connection provided by a via provides an electrical pathway from one feature to another feature. A via may be filled with conductive material, insulating material, and/or other materials used in the art. Furthermore, a via may be formed on the substrate including an opening in one or more layers on the substrate, including dielectric layers, metal layers, semiconductor layers, and/or other features known in the art.

Herein, cross-sectional diagrams of FIG. 1 to FIG. 7 are illustrations of an exemplary embodiment of a PPI structure formed in a TSV process.

Figure 1:
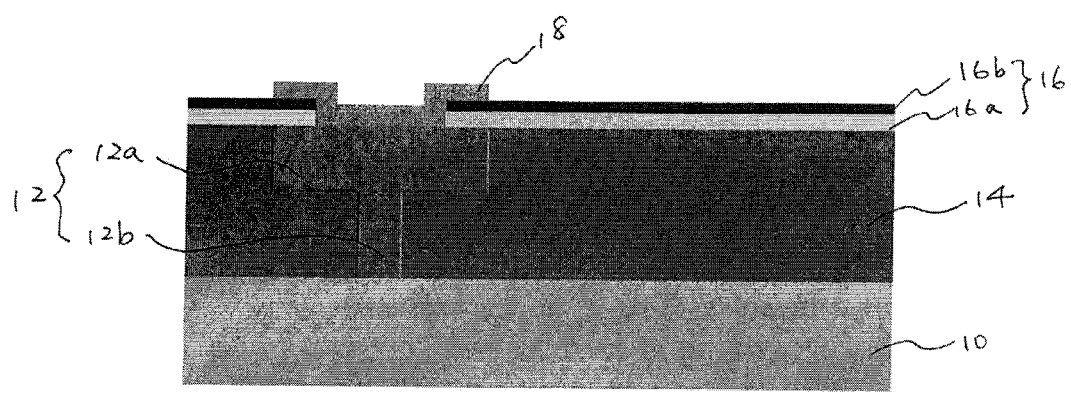
FIG. 1 to FIG. 7 are cross-sectional diagrams of exemplary embodiments of a post passivation interconnect (PPI) structure formed in a TSV process.

With reference now to FIG. 1, there is shown a cross-sectional diagram of a wafer 100 including a semiconductor substrate 10, and an interconnect structure 12 over the semiconductor substrate 10. The semiconductor substrate 10 is formed of silicon, although other semiconductor materials including group III, group IV, group V elements and SiGe may also be used. Alternatively, the semiconductor substrate 10 includes non-conductive layers. Integrated circuits including transistors, resistors, capacitors, and other known components are formed on the semiconductor substrate 10.

The interconnect structure 12 includes metal lines and vias formed in dielectric layers 14, which are typically low-k dielectric layers 14. The interconnect structure 12 includes metallization layers stacked layer by layer, with metal lines formed in the metallization layers, and vias connecting metal lines. The interconnect structure 12 interconnects the integrated circuits formed on the top surface of semiconductor substrate 10, and connects the integrated circuits to bond pads. For example, metal lines 12a and vias 12b are formed in dielectric layers 14, which are low-k dielectric layers having dielectric constants (k values) less than about 3.5. In an embodiment, the dielectric layers 14 are formed of extreme low-k dielectric layers having k values less than about 2.5. In some embodiments, interconnect structure 12 further includes upper dielectric layers on top of low-k dielectric layers 14, wherein the upper dielectric layers comprise non-low-k dielectric materials having no moisture absorption problem. The k values of the upper dielectric layers are greater than about 3.5, and more preferably greater than about 3.9. In an embodiment, the upper dielectric layers include un-doped silicate glass (USG) layers.

FIG. 1 also illustrates a contact-bonding (CB) pad 18, which is used in the bonding process to connect the integrated circuits in the respective chip to external features. The CB pad 18 is formed in a first passivation layer 16 to connect to the underlying metal line 12a. In the fabrication of the CB pad 18, the first passivation layer 16 including, for example, a first dielectric layer 16a and a second dielectric layer 16b is deposited on the top-level layer of the dielectric layers 14, and then patterned and etched to form an opening, exposing a portion of the underlying metal line 12a. A conductive material is then deposited in the opening and patterned to form the CB pad 18. The first passivation layer 16 may be formed of dielectric materials such as silicon oxide, silicon nitride, polyimide, or combinations thereof. In an embodiment, the first dielectric layer 16a is a silicon oxide layer, and the second dielectric layer 16b is a silicon nitride layer. In some embodiments, conductive material of the CB pad 18 includes metals selected from aluminum, tungsten, silver, copper, aluminum alloys, copper alloys, and combinations thereof.

Figure 2:
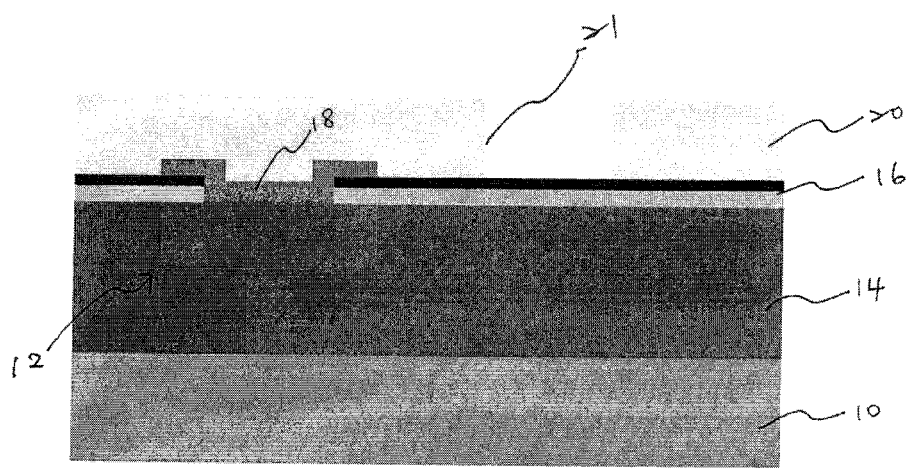
Figure 3:
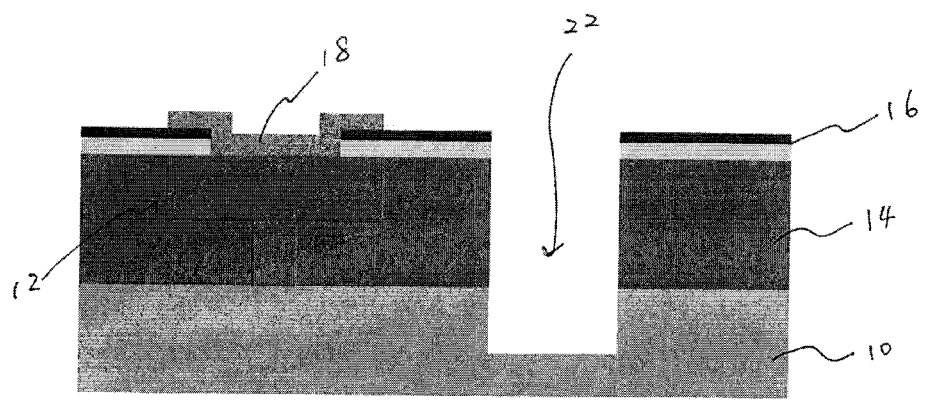

FIG. 2 and FIG. 3 illustrate the formation of a TSV opening 22, which extends into the semiconductor substrate 10. Referring to FIG. 2, a photoresist layer 20 is spin coated on the first passivation layer 16 and the CB pad 18. The photoresist layer 20 is then patterned by exposing, baking, developing, and/or other photolithography processes known in the art to provide an opening 21 in the photoresist layer 20, exposing a portion of the first passivation layer 16. As illustrated in FIG. 3, the method then proceeds to etch exposed layers, using the patterned photoresist layer 20 as a masking element to form a TSV opening 22 passing through the first passivation layer 16, the dielectric layer 14 and a portion of the semiconductor substrate 10. The photoresist layer 20 is then stripped. In some embodiments, the TSV opening 22 is etched using any suitable etching method including, for example, a plasma etch, a chemical wet etch, a laser drill, and/or other processes known in the art. In an embodiment, the TSV opening 22 is etched using a reactive ion etch (RIE). In some embodiments, the TSV opening 22 is approximately 100 μm~300 μm in depth. The etching process may result in an opening having a vertical sidewall profile or a tapered sidewall profile.

Figure 4:
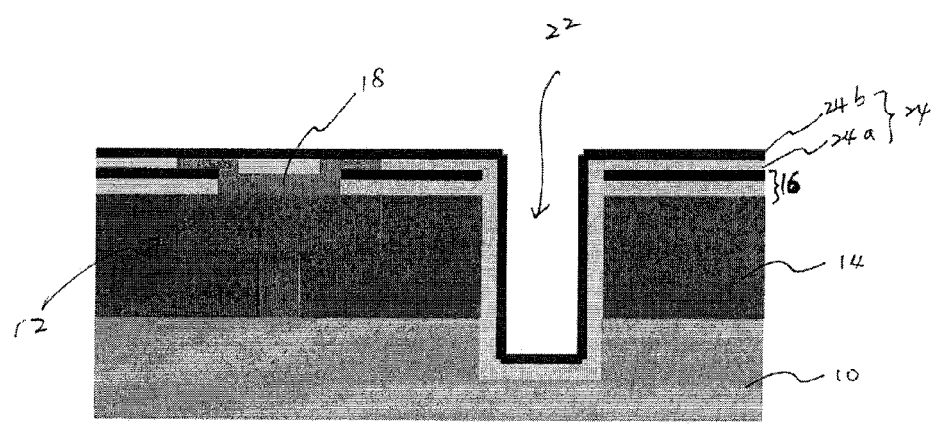

FIG. 4 illustrates the formation of a second passivation layer 24. The second passivation layer 24, for example including a first isolation film 24a and a second isolation film 24b, is blanket formed on the first passivation layer 16 and the CB pad 18, and lines the sidewalls and bottom of the TSV opening 22. In some embodiments, the second passivation layer 24 is formed of dielectric materials such as silicon oxide, silicon nitride, polyimide, and the like. The formation methods include plasma-enhanced chemical vapor deposition (PECVD) or other commonly used CVD methods. In an embodiment, the first isolation film 24a is a silicon oxide layer, and the second isolation film 24b is a silicon nitride layer.

Figure 5:
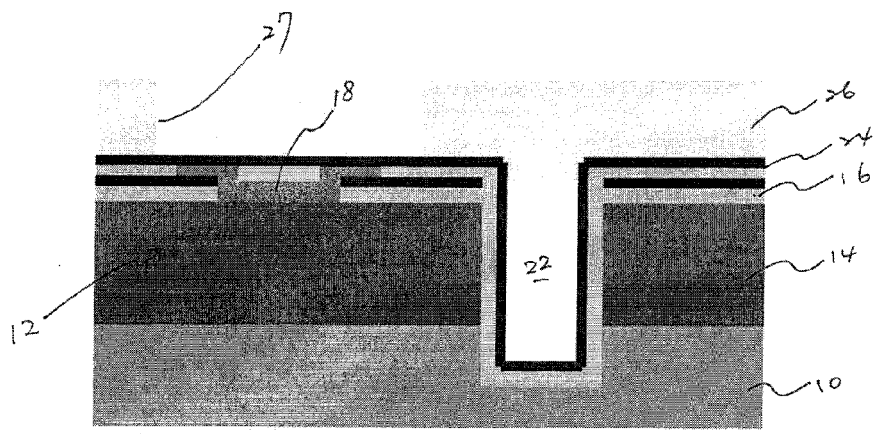
Figure 6:
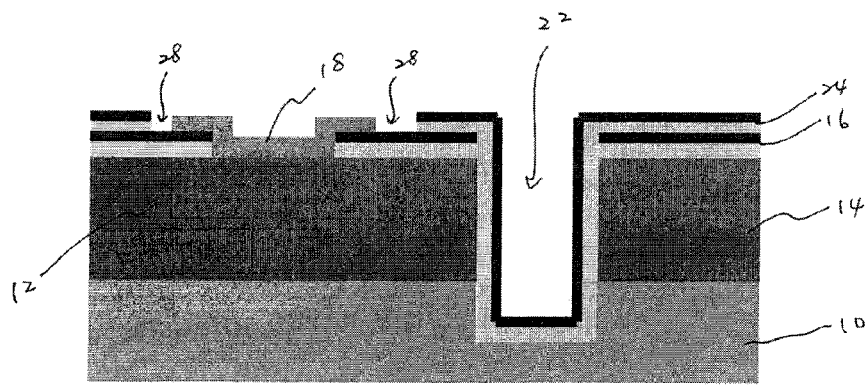

FIG. 5 and FIG. 6 illustrate the formation of via openings 28 in the second passivation layer 24 adjacent to the CB pad 18. Referring to FIG. 5, a mask 26 is formed on the previously formed structure. In an embodiment, the mask 26 includes an organic material such as Ajinimoto buildup film (ABF). The ABF film is first laminated on the structure shown in FIG. 5. Heat and pressure are then applied to the laminated film to soften it so that a flat top surface is formed. In the resulting structure, the mask 26 has a thickness greater than about 5 μm, and more preferably between about 10 μm and about 100 μm. However, the mask 26 may include other materials such as Prepreg and resin coated copper (RCC). Alternatively, the mask 26 is a photo resist, which may either be a positive photo resist or a negative photo resist. The mask 26 is then patterned to form an opening 27, exposing portions of second passivation layer 24 overlying the CB pad 18 and peripheral regions thereof. The patterned mask 26 covers the TSV opening 22.

As illustrated in FIG. 6, the method then proceeds to etch the exposed portions of the second passivation layer 24, using the patterned mask 26 as a masking element to expose the CB pad 18 and form at least one via opening 28 in the second passivation layer 24 adjacent to the CB pad 18. In an embodiment, the via opening 28 is a ring-shaped opening surrounding the CB pad 18, for example a ring-shaped opening with an octangular profile. The via opening 28 is etched using any suitable etching method including, for example, a plasma etch, a chemical wet etch and/or other processes known in the art. In an embodiment, the via opening 28 is etched using a reactive ion etch (RIE). After the passivation etching process, the mask 26 is then removed. If the mask 26 is a dry film, it may be removed by an alkaline solution. If the mask 26 is formed of photo resist, it may be removed by acetone, n-methyl pyrrolidone (NMP), dimethyl sulfoxide (DMSO), aminoethoxy ethanol, and the like. As a result, the TSV opening 22 lined with the second passivation layer 24 is exposed.

Figure 7:
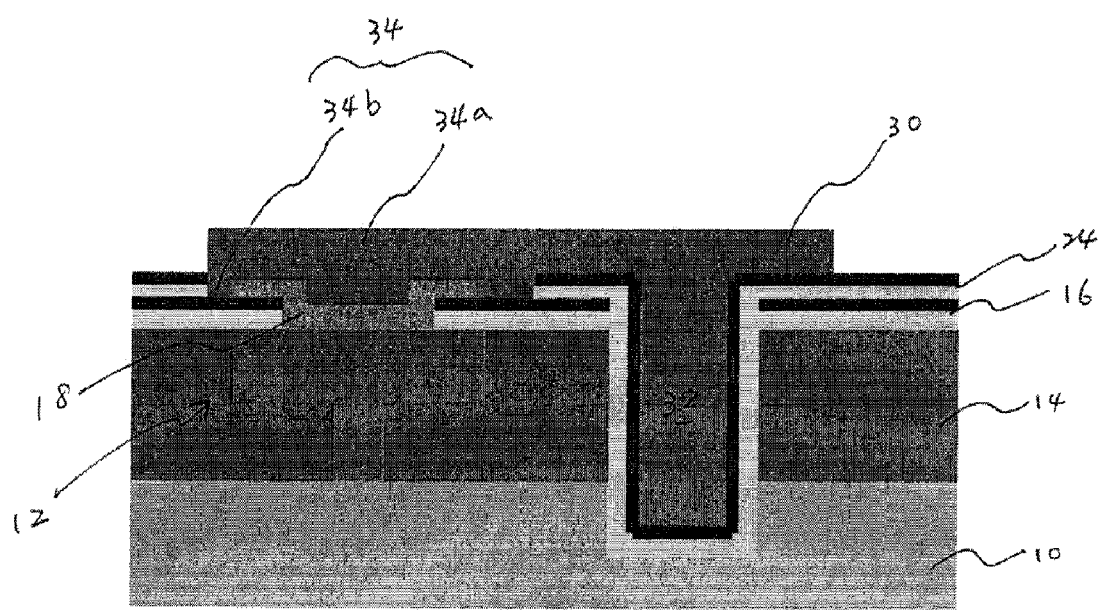

Next, as is shown in FIG. 7, a conductive material layer 30 is deposited on the resultant structure to fill the TSV opening 22 and the desired regions outside of TSV opening 22 thereby forming a conductive plug 32. Throughout the description, the conductive plug 32 is referred to as a through-silicon via (TSV). In an embodiment, the conductive material layer 30 includes copper or copper alloys. Other metals, such as aluminum, silver, gold, titanium, titanium, and combinations thereof, may also be used. The formation methods may include sputtering, printing, electroplating, electroless plating, and commonly used chemical vapor deposition (CVD) methods. At the time the TSV opening 22 is filled with the conductive material layer 30, the same conductive material is also formed on the CB pad 18 and fills the via opening 28, forming a post-passivation interconnect (PPI) structure 34. The PPI structure 34 includes an upper portion 34a and a lower portion 34b for capping the CB pad 18. The upper portion 34a is referred to a conductive line 34a, and the lower portion is referred to a support 34b. The conductive line 34a is formed on the CB pad 18 and connected to the underlying support 34b. The conductive line 34a also extends to connect to the top of the TSV 32. The support 34b is formed in the via opening 28 of the second passivation layer 24 adjacent to the CB pad 18. Thus, the PPI structure 34 caps the CB pad 18 to provide good adhesion and reduce contact resistance therebetween. In an embodiment, the support 34b is a metal ring surrounding the CB pad 18. Alternatively, the support 34b includes a plurality of metal pillars adjacent to the CB pad 18. In an embodiment, the PPI structure 34 has a thickness less than about 30 μm, for example, between about 2 μm and about 25 μm. Then the conductive material layer 30 is patterned to form a resulting structure as depicted in FIG. 7. The PPI structure 34 is formed using the same process as forming the TSV 32, and interconnects the TSV 32 to the CB pad 18, which is further connected to the active circuits.

In an embodiment of forming the conductive layer 30, a copper seed layer may also be formed of PVD, sputtering or electroless plating, and then plating copper to fill the desired regions. The filling process is well known in the art, and hence is not repeated herein. The formation methods may include sputtering, printing, electro plating, electroless plating, and commonly used chemical vapor deposition (CVD) methods. Before forming the copper seed layer and the copper layer, a diffusion barrier layer may be blanket deposited, covering the exposed portions. The diffusion barrier layer may include commonly used barrier materials such as titanium, titanium nitride, tantalum, tantalum nitride, and combinations thereof, and can be formed using physical vapor deposition, sputtering, and the like.

In subsequent steps, a glass wafer may be mounted on the top surface of the structure formed in the previously discussed step. A wafer grinding is then performed to thin the back surface of the semiconductor substrate 10 until the TSV 32 is exposed. The glass wafer is then de-mounted. In some embodiments, the method includes further process steps such as metallization processes to provide interconnections, and/or other processes known in the art.

In the preceding detailed description, specific embodiments are described. It will, however, be evident that various modifications, structures, processes, and changes may be made thereto without departing from the broader spirit and scope thereof. The specification and drawings are, accordingly, to be regarded as illustrative and not restrictive. It is understood that the disclosed embodiments are capable of using various other combinations and environments and are capable of changes or modifications within the scope of the concepts as expressed herein.

What is claimed is:

1. An integrated circuit structure, comprising:
    a semiconductor substrate;
    a through-silicon via (TSV) extending into the semiconductor substrate;
    a pad formed over the semiconductor substrate and spaced apart from the TSV;
    a dielectric layer formed over the semiconductor substrate and surrounding the pad; and
    an interconnect structure formed over the dielectric layer and electrically connecting the TSV and the pad;
    wherein the interconnect structure comprises
        an upper portion which is formed directly on the pad and extends laterally into direct electrical connection with the TSV; and
        a lower portion outside the TSV, and extending downwardly from the upper portion into the dielectric layer to be in direct contact with the dielectric layer and to be co-elevational with the pad.

2. The integrated circuit structure of claim 1, wherein the interconnect structure and the TSV are formed of the same conductive material.

3. The integrated circuit structure of claim 1, wherein at least one of the TSV or the interconnect structure comprises copper.

4. The integrated circuit structure of claim 1, wherein the lower portion of the interconnect structure is positioned between the TSV and the pad.

5. The integrated circuit structure of claim 1, wherein the pad comprises aluminum or an aluminum alloy.

6. The integrated circuit structure of claim 1, wherein the dielectric layer comprises a passivation layer formed between the semiconductor substrate and the upper portion of the interconnect structure and surrounding the lower portion of the interconnect structure.

7. The integrated circuit structure of claim 6, wherein the passivation layer extends into the semiconductor substrate to line the sidewall and bottom of the TSV.

8. The integrated circuit structure of claim 6, wherein the passivation layer comprises two isolation layers.

9. The integrated circuit structure of claim 6, wherein the passivation layer comprises silicon oxide, silicon nitride, or a combination thereof.

10. The integrated circuit structure of claim 1, wherein the lower portion includes a plurality of pillars around the pad.

11. An integrated circuit structure, comprising:
    a semiconductor substrate;
    a through-silicon via (TSV) extending into the semiconductor substrate;
    a pad formed over the semiconductor substrate and spaced apart from the TSV; and
    an interconnect structure formed over the semiconductor substrate and electrically connecting the TSV and the pad;
    wherein the interconnect structure comprises an upper portion formed on the pad and a lower portion adjacent to the pad, and the upper portion extends to electrically connect the TSV; and
    wherein the lower portion of the interconnect structure is a ring surrounding the pad.

* * * * *